United States Patent [19]

Riseman

[11] Patent Number: 4,521,952
[45] Date of Patent: Jun. 11, 1985

[54] METHOD OF MAKING INTEGRATED CIRCUITS USING METAL SILICIDE CONTACTS

[75] Inventor: Jacob Riseman, Poughkeepsie, N.Y.

[73] Assignee: International Business Machines Corporation, Armonk, N.Y.

[21] Appl. No.: 446,156

[22] Filed: Dec. 2, 1982

[51] Int. Cl.³ ............... H01L 21/265; H01L 21/24; C23F 1/02
[52] U.S. Cl. .................. 29/590; 29/571; 29/576 B; 29/578; 148/1.5; 148/187; 357/34; 357/15; 357/91; 427/84; 427/88
[58] Field of Search ............. 29/590, 576 B, 571, 29/578; 148/1.5, 187; 357/34, 91, 15; 427/84, 88

[56] References Cited

U.S. PATENT DOCUMENTS

| 4,332,837 | 6/1982 | Peyre-Levigne | 427/86 |
| 4,337,476 | 6/1982 | Fraser et al. | 427/93 |
| 4,338,138 | 7/1982 | Cavaliere et al. | 148/1.5 |
| 4,339,869 | 7/1982 | Reihl et al. | 29/576 B |
| 4,343,082 | 8/1982 | Lepselter et al. | 29/576 B |
| 4,381,953 | 5/1983 | Ho et al. | 148/1.5 |
| 4,385,433 | 5/1983 | Ozawa | 29/576 B |
| 4,400,865 | 8/1983 | Goth et al. | 29/571 |
| 4,400,866 | 8/1983 | Yeh et al. | 29/571 |
| 4,419,810 | 12/1983 | Riseman | 29/571 |

OTHER PUBLICATIONS

Campbell et al., IBM-TDB, 25 (1983), 6624.
Berenbaum et al., IBM-TDB, 22 (1980), 3206.

Primary Examiner—Upendra Roy
Attorney, Agent, or Firm—George O. Saile

[57] ABSTRACT

A metal silicide contact to silicon devices which has broad application to almost all of the variety of silicon semiconductor devices is described. This contact with a substantial side component has particular advantage as the base contact for a bipolar transistor. However, contacts can be made to regions of any desired device regions with a variety of P+, N+, P, N, P−, N− and so forth conductivity types. Further, the contact can be an ohmic or Schottky contact.

15 Claims, 9 Drawing Figures

METHOD OF MAKING INTEGRATED CIRCUITS USING METAL SILICIDE CONTACTS

DESCRIPTION

1. Technical Field

This invention relates to high performance, densely packed bipolar devices in an integrated circuit structure and the method for manufacturing such integrated circuits wherein metal silicide contacts are made to regions therein.

2. Background Art

The use of a metal silicides, such as molybdenum silicide, tantalum silicide, tungsten silicide and the like in integrated circuit structures has been finding increased usage. Examples of these techniques may be found in U.S. Pat. No. 4,180,596; U.S. Pat. No. 4,128,670; U.S. Pat. No. 4,329,706; the publication by M. Morimoto et al. entitled "An Mo Gate 4k Static RAM Fabricated Using a Novel Direct Contact Technology" published in the IEDM Proceedings 1981, pp. 655 through 658; the publication by S. P. Muraika et al. entitled "Refractory Silicides of Titanium and Tantalum for Low-Resistivity Gates and Interconnects" published in IEEE Transactions on Electron Devices, Vol. ED-27, No. 8, August 1980, pp. 1409-1417; and the publication by E. Nagasawa et al. entitled "Mo-silicided Low Resistance Shallow Junctions" published in 1982 Symposium on VLSI Technology Digest of Technical Papers, Sept. 1-3, 1982, pp. 26-27. A distinct advantage for metal silicide layers is their very low resistivity characteristic. As a result of this low resistivity it is possible to scale down the metal line widths over competing metallurgies in large scale integrated devices.

The importance of integrated circuits which are based upon a bipolar technology in digital and analog applications is well known. In a large number of integrated circuit applications, the two important transistor characteristics are the current gain, beta and the gain bandwidth frequency, $f_t$. Maximization of these two quantities is highly desirable. In addition, a miniaturization of the base resistance without sacrificing either current gain or gain bandwidth frequency is also usually highly desirable.

Maximization of the current gain and gain bandwidth frequency is sought, among other means through miniaturization of the transistor's intrinsic base width, that is, the width of the base region directly beneath the emitter. The intrinsic base resistance, of course, undesirably increases in this process. Intrinsic base resistance is then attempted to be reduced as much as possible by keeping the horizontal emitter width to a minimum value allowed by the state of the current manufacturing techniques. In the transistors of the prior art, the base resistance also has an equally significant extrinsic component. This results from the relatively large distance between the location of the base ohmic contact and the edge of the intrinsic base region. A relatively large distance is once again undesirably dictated by conventional manufacturing techniques of the art.

There are undesirable consequences of the presence of the extrinsic base regions surrounding the emitter. One consequence is the existence of the emitter base sidewall junction capacitance. A further undesirable consequence of the extrinsic base region surrounding the emitter is that a portion of the electrons injected by the emitter in the forward bias condition of the emitter base junction have to travel a large distance in the extrinsic base region before they can reach the base collector junction. These adverse effects have been attempted to be minimized in the prior art through the miniaturization of the emitter base junction depth.

The C. G. Jambotkar U.S. Pat. No. 4,195,307 and L. Maheux IBM Technical Disclosure Bulletin, Vol. 11, No. 12, May 1969, pp. 1690 and 1691 have described techniques for overcoming this side injection problem described in the preceding paragraph. The solution to this problem in these references is to form a mesa emitter structure using etching techniques. Passivation with a suitable dielectric material covers the side portions of the mesa emitter. The base region extends below the mesa emitter to the surrounding areas around the mesa region. Therefore, the emitter base junction is substantially in one plane, that is, substantially without a sidewall component. These processes required to manufacture these structures, while effective in eliminating the side injection problem, however, are somewhat complex.

U.S. Pat. Nos. 4,209,349 and 4,209,350 by I. T. Ho and J. Riseman, U.S. Pat. No. 4,234,362 by J. Riseman and U.S. Pat. No. 4,456,514 by H. B. Pogge describe methods for forming narrow dimensioned, for example sub-micrometer regions, on a silicon body. These patents all involve the formation of substantially horizontal surfaces and substantially vertical surfaces on the silicon body and then forming a layer of very narrow dimension on both the substantially horizontal and substantially vertical surface. This layer is then subjected to an anisotropic etching process such as by reactive ion etching, to substantially remove the horizontal layer while leaving the vertical layer substantially intact. The vertical layer dimension is adjusted depending upon the original thickness of the layer applied. In this way, very narrow dimensioned passivating layers can be formed on sidewalls of structures.

It is an object of this invention to provide a highly conductive metal silicide contact to a silicon semiconductor device which contact has a significant side component which both shortens the electrical path to an adjacent device element and increases the total surface area of the contact contacting the silicon over the usual solely one surface contact.

It is a further object of this invention to provide a highly dense, high performance bipolar integrated circuit wherein the bipolar transistors base contacts which are highly conductive and have a substantial side contact component are manufacturable by a relatively simple process.

It is a still further object of this invention to provide high performance bipolar transistors having substantially no side injection wherein a metal silicide contact is used to the extrinsic base region surrounding the emitter region and wherein the base contacts are highly conductive with a substantial side contact component.

SUMMARY OF THE PRESENT INVENTION

A metal silicide contact to silicon devices which has broad application to almost all of the variety of silicon semiconductor devices is described. This contact with a substantial side component has particular advantage as the base contact for a bipolar transistor. However, contacts can be made to regions of any desired device regions with variety of P+, N+, P, N, P−, N− and so forth conductivity types. Further, the contact can be an ohmic or Schottky contact.

A bipolar transistor integrated circuit having highly conductive base contacts with a substantial side contact component is described. The integrated circuit includes a plurality of bipolar transistors electrically isolated from one another in a monocrystalline silicon body. Each of the transistors include an emitter region, and a base region which contains both extrinsic and intrinsic regions. The extrinsic base region surrounds the emitter region in the semiconductor body. The intrinsic base region forms a junction within the emitter region. A polycrystalline silicon ohmic contact is made to the emitter region. A refractory metal silicide ohmic contact is made to the extrinsic base region and completely surrounds the emitter region. An insulator barrier separates the polycrystalline silicon contact from the metal silicide contact. The metal silicide contact extends into the silicon body so that its side edge as well as bottom makes contact with the extrinsic base region. The side contact component shortens the path between this contact and the emitter-base junction.

The bipolar transistor integrated circuit of the preceding paragraph can be improved in performance by reducing side emitter injection. This is accomplished by providing a mesa emitter having an insulator barrier surrounding the mesa. All other elements of the bipolar structure of the previous paragraph remains so that the substantial side contact advantages remain therewith.

A process is described for fabricating the aforementioned bipolar integrated circuit structure wherein the structures contain a refractory metal silicide base contact for each of the bipolar transistors. A silicon semiconductor body is provided having a subcollector region and with one major surface region of the monocrystalline silicon dielectric isolated from other such regions. A dielectric isolation is also preferably provided between the emitter-base portion and the collector reach-through portion of each of the silicon isolated regions which are designated to contain bipolar transistors. Layers of polycrystalline silicon and an insulator are sequentially deposited on the major surface of the polycrystalline silicon. It is preferred that the insulator is a composite layer of silicon dioxide and silicon nitride in that order. Portions of the layers of polycrystalline silicon and insulator are removed to form openings to the monocrystalline silicon surface above portions designated to be the base contact areas and leaving the layers covering the designated emitter portion. The extrinsic base region of the bipolar transistor is formed through these openings. A conformal insulator layer is formed upon the sidewall of the openings. A layer of refractory metal is deposited over the major surface and the structure heated to a temperature sufficient to cause the formation of a refractory metal silicide where the refractory metal is directly on portions of the monocrystalline silicon designated to be the base contact. The unreacted refractory metal over insulating layers is removed by chemical etching. The surface of the refractory metal silicide is oxidized to form a silicon dioxide layer thereon. The result of these steps is a metal silicide contact below the major surface of the silicon body which has a substantial side component. Reactive ion etching is utilized to remove the insulator layer covering the polycrystalline silicon layer over designated emitter portion which leaves a portion of the silicon dioxide layer remaining over the refractory metal silicide. The emitter region is formed preferably by ion implantation into the polycrystalline silicon layer and drive-in from the polycrystalline silicon layer. The intrinsic base region may be formed early in the process before the deposition of the polycrystalline silicon layer or it may be formed prior to the formation of the emitter region by ion implantation and drive-in from the polycrystalline silicon region. Electric contacts are now made to the elements of the bipolar transistor.

Where it is desired to overcome emitter side injection in the process of the proceeding paragraph, the monocrystalline silicon body is partially removed by etching in the designated extrinsic base region following the removal of portions of the layers of polycrystalline silicon and insulator layers. The process continues as described in the above paragraph to form the sidewall insulator around a mesa emitter structure to overcome the side emitter injection.

DISCLOSURE OF THE INVENTION

Figure 1:
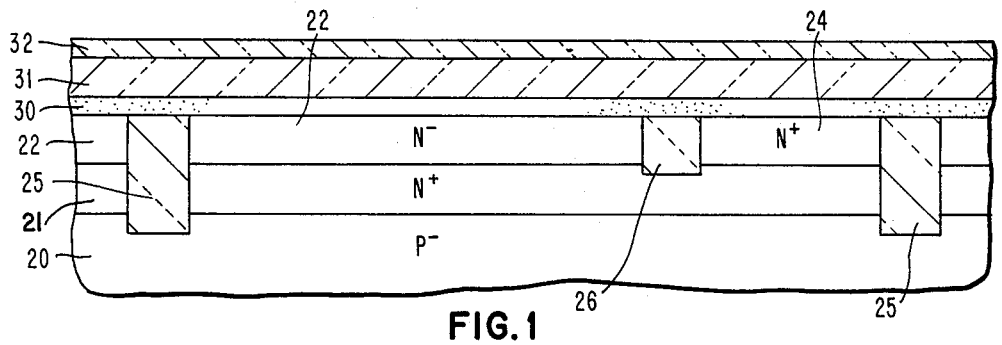
FIGS. 1 through 7 schematically illustrate the process for forming the high performance bipolar transistor with refractory metal silicide base contact of the present invention.

Referring now more particularly to FIGS. 1 through 7, the manufacturing steps for a bipolar transistor utilizing the present method is described. FIG. 1 illustrates one small, greatly enlarged portion of a silicon body which will be used to form a very dense bipolar integrated circuit. A P− substrate of monocrystalline silicon 20 has a blanket subcollector N+ diffusion 21 made therein. An epitaxial N layer 22 is then grown on top of the substrate. These processes are standard processes in the formation of, for example, NPN bipolar transistors. The substrate is typically a <100> crystallographic orientation silicon wafer having a resistance of the order of 1 to 20 ohm-cm. The subcollector diffusion is typically formed using arsenic having a surface concentration of about $10^{20}$ atoms/cm$^3$. The epitaxial growth process to form layer 22 may be by conventional techniques, such as the use of SiCl$_4$/H$_2$ or SiH$_4$ mixtures at temperatures about 1000° C. to 1200° C. During the epitaxial growth the dopant in the N+ layer moves into the epitaxial layer. The thickness of the epitaxial layer for highly dense integrated circuits is of the order of 3 micrometers or less.

The next series os steps involves the formation of isolation means for isolating regions of monocrystalline silicon from other regions of monocrystalline silicon. The isolation may be by back biasing PN junctions, partial dielectric isolation or complete dielectric isolation. The dielectric materials used may be silicon dioxide, glass, etc. The preferred isolation for highly dense integrated circuits is dielectric isolation. The FIG. 1 shows partial dielectric isolation with dielectric regions 25 isolating monocrystalline silicon regions of the silicon body from one another and a region 26 which isolates the base emitter region from the collector reach-through region. There are many ways in the art to form dielectric regions of this type. One such process is described in the J. A. Bondur, et al. U.S. Pat. No. 4,104,086, issued Aug. 1, 1978 and assigned to the assignee of the present patent application. In that patent application the process for forming partial dielectric isolation for regions 25 and 26 is described in detail. The major surface having this isolation cleaned of all masking layers. The N+ reach-through region 24 may be formed at this time by using a silicon dioxide or photoresist mask. Alternatively, region 24 can be formed at a later point in the process.

There is now deposited a polycrystalline silicon layer 30 over the entire surface having the surface isolation pattern 25, 26. The polycrystalline silicon layer 30 may be deposited by any of a variety of techniques one of which is by way of example using silane in a temperature range of about 500° to 1000° C. and preferably about 600° C. The operative thickness of the polycrystalline silicon layer is between about 50 to 300 nanometers with about 50 to 100 namometers preferred. The polycrystalline silicon layer in this embodiment is in direct contact with the monocrystalline silicon body. The polycrystalline silicon layer 30 may be doped as deposited or may be deposited subsequently substantially undoped and then doped by a subsequent ion implantation and heating process. In making an NPN bipolar transistor, the polycrystalline silicon layer may be doped by ion implantation of boron ions for subsequent outdiffusion to form the intrinsic base region of the bipolar transistor under construction. The ion implantation dosage in this alternative is between about $1 \times 10^{14}$ to $1 \times 10^{15}$ ions/cm$^2$ at 50 to 80 KeV. However, in the present alternative illustrated in FIGS. 1 through 7 the doping of the intrinsic base region is done at a later time. Therefore, the polysilicon layers 30 is left substantially undoped.

An insulator layer is now deposited over the polycrystalline silicon layer 30. The insulated layer is preferably a composite of silicon dioxide layer 31 and silicon nitride layer 32. The silicon dioxide layer 31 may be chemically vapor deposited in, for example, using SiH$_4$Cl$_2$ and H$_2$O at a temperature of about 800° C. or less under atmospheric or low pressure conditions. Alternatively, the layer can be thermally grown in an oxygen or oxygen-water vapor ambient at a temperature of about 970° C. In this alternative, the polycrystalline silicon layer 30 would be required to be thicker, for example, 50 nm additional polycrystalline silicon for 100 nm of thermal silicon dioxide. The operative thickness of the silicon dioxide layer is between about 100 to 300 namometers and a preferred thickness of 100 to 150 nanometers. A deposition of the silicon nitride layer 32 is usually formed by chemical vapor deposition using the process conditions of silane, ammonia and nitrogen carrier gas at a temperature or about 800° C. or higher using atmospheric or low pressure conditions as discussed in the V. Y. Doo U.S. Pat. No. 4,089,992. The operative thickness of the silicon nitride layer is between about 50 to 150 nanometers and 100 nanometers is preferred. The resulting structure is shown in FIG. 1.

Standard lithographic and etching techniques are utilized to form openings in the layers 32, 31, and 30 down to the monocrystalline silicon body. The openings in these layers are located where it is desired to have the base contact areas and the layered structure is left covering the designated emitter portion and the collector reach-through portion of the bipolar devices under fabrication.

The extrinsic base region is formed by diffusion or implantation of boron ions to form P+ regions 34 in the N-epi region 22. The implant boron regions 34 for an NPN transistor is self-registering to produce the structure of FIG. 2. The surface concentration is of the order of 10° atoms/cm$^3$.

The etching step utilizing for the layered structure 32, 31, and 30 is preferably an anisotropic etching process utilizing carbon tetrafluoride or chlorinated hydrocarbon gases such as described in J. S. Lechaton and J. L. Mauer "A Model for Etching of Silicon in Cl$_2$/Ar Plasma" in Plasma Process-Proceedings Symposium on Plasma Etching and Deposition, R. G. Frieser et al., the Electrochemical Society 1981, pp. 75-85 or Harvilchuck patent application Ser. No. 594,413, filed July 9, 1975, now abandoned and continuation patent application Ser. No. 960,322, filed Nov. 13, 1978. It may be preferable to use different etchants for each of the layers such as carbon tetrafluoride, CF$_4$, for silicon nitride, CF$_4$—H$_2$ for silicon dioxide and CF$_4$ for polycrystalline silicon.

Figure 3:
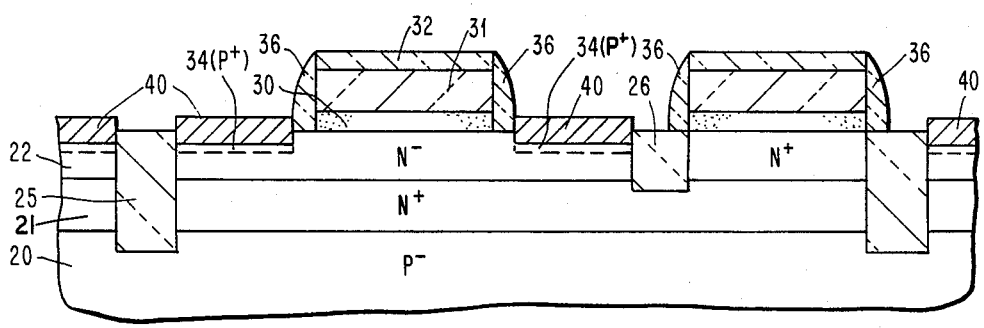

A sidewall insulator layer 36 is formed upon vertical sidewalls of the layered structure 32, 31, and 30. This layer 36 is preferably silicon dioxide. However, the layer may alternatively be composed of silicon nitride, or the like or combinations of these insulators with silicon dioxide. A silicon dioxide layer may be formed by a vapor deposition process wherein silane, oxygen at 450° C. is used or SiH$_2$Cl$_2$ and N$_2$O at a temperature of about 800° C. under atmospheric or low pressure conditions are utilized. This layer is uniformly deposited to a precise thickness over the layers 32, 31, 30 on both the horizontal and vertical surfaces thereof. This layer 36 is then subjected to preferential removal from the horizontal surfaces while substantially leaving the layer upon the substantially vertical sidewalls in an anisotropic etching ambient. The etching may be done, for example, in a reactive ion etching system using CF$_4$ and H$_2$ gases as described in L. M. Ephrath, J. Electrochem. Society, Vol. 124, p. 284C (1971). The result of the sidewall formation is shown in FIG. 3. A thickness of the sidewall 36 is preferably between about 200 to 500 nanometers.

The next series of steps involving the formation of metal silicide extrinsic base contacts is critical to the structure of the present invention which substantially eliminates the side injection of the emitter. A refractory metal may be deposited by sputtering, vacuum evaporation or chemical vapor deposition uniformly over the structure with openings to the monocrystalline silicon body where the extrinsic base contact areas are desired. The preferred refractory metals are tantalum, tungsten, titanium and molybdenum because other refractory metals have limitations as to subsequent thermal processing. Other refractory metals cannot withstand the elevated temperatures normally used in subsequent processing. The operative thickness deposited of the refractory metal is between about 50 to 200 nanometers and the preferred thickness is about 50 to 100 nanometers. The structure is heated to an elevated temperature which is preferably between about 800° to 1,000° C. to form the refractory metal silicide. In the regions having exposed silicon, the metal silicide is formed. In areas having a coating of silicon dioxide or silicon nitride no reaction occurs with the refractory metal. After the heating step the unreacted refractory metal is removed by chemical or plasma etching. The result of this process is shown in FIG. 3 where the refractory metal silicide contacts 40 have been formed. It should be noted that the refractory metal and the monocrystalline silicon react to form the refractory metal silicide layer 40 so that the resulting ohmic contact does extend into the silicon body by this amount. The P+ external base region 34 will move more deeply into the monocrystalline silicon body during this formation due to heating moved by diffusion during this heating formation.

The structure is now subjected to wet oxygen atmosphere to form a silicon dioxide layer 42 on the refractory metal silicide layer 40. The temperature of the oxidation is preferably of the order of 970° C. The thickness of the silicon dioxide layer 42 is between about 100 to 350 nanometers and preferably 150 to 250 nanometers. The metal silicide contact is uneffected by the oxidation and sinks into the monocrystalline silicon extrinsic base region between about 50 to 150 nanometers. The process and mechanism can be even further understood by reference to "Refractory Silicides of Titanium and Tantalum for Low-Resistivity Gates and Interconnects" by S. P. Muraka et al. published in IEEE Trans. on Elec. Devices, Vol. 27, No. 8, August 1980, pp. 1409–1417. The oxidation preferably is done at about 750° C. to 900° C. at high pressure, for example 10 atmospheres.

The depth of the metal silicide contact extends into the monocrystalline silicon body in the case of the base contact of the bipolar transistor is about the depth or up to 50 percent more than the depth of the emitter-base junction. The emitter-base junction in very large scale integrated circuits of today ranges from about 100 to 250 nanometers, so the depth of the metal silicon contact into the silicon is from about 150 to 350 nanometers.

Figure 5:
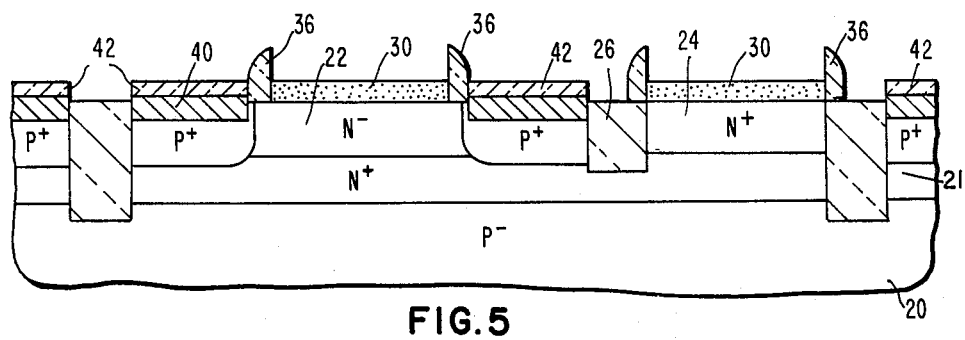
Figure 6:
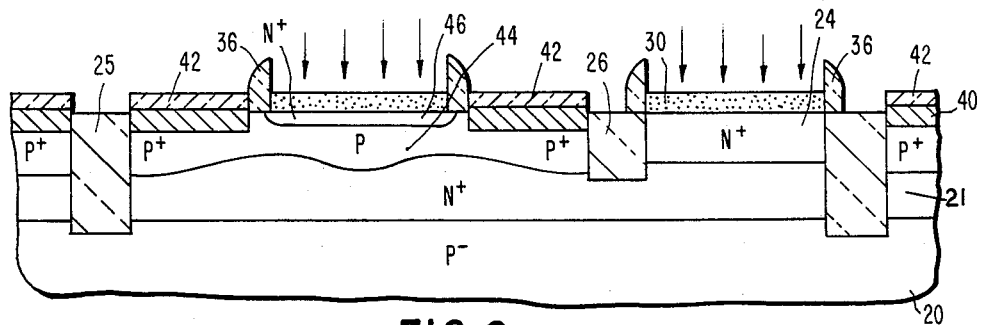

The insulator layer composed of silicon nitride layer 32 and silicon dioxide layer 31 is removed by reactive ion etching down to polycrystalline silicon layer 30. The usual reactive ion etching ambient for the silicon nitride is $CF_4$ and for the silicon dioxide is $CF_4$—$H_2$. The reactive ion etching leaves about 100 nanometers of silicon dioxide on the metal silicide surface. The thickness of that silicon dioxide on the masking layer 30, 31, 32 was chosen for that reason. It also leaves the height of the silicon dioxide sidewall structure 36. The result of this process is shown in FIG. 5.

The intrinsic base region is formed by ion implantation of boron ions into the polycrystalline silicon layer 30 and an outdiffusion from that layer at a temperature of about 900° to 1,000° C. to form the intrinsic base region 44. The collector reach-through region is so heavily N+ doped that the boron dosage would give a concentration substantially less than an order of magnitude from that of the N+. Therefore, the masking of the collector reach-through would not have to be required. However, if desired, a photoresist block-out mask can be used to cover the collector reach-through during this boron ion implantation. Arsenic ions are then implanted into the polycrystalline silicon layer 30 as indicated by the arrows and driven-in at a temperature of about 900° to 1,050° C. to form emitter region 46 having a surface concentration of the order of $10^{20}$ atoms/$cm^3$. The collector reach-through region also produces a N+ surface region by this process.

Figure 7:
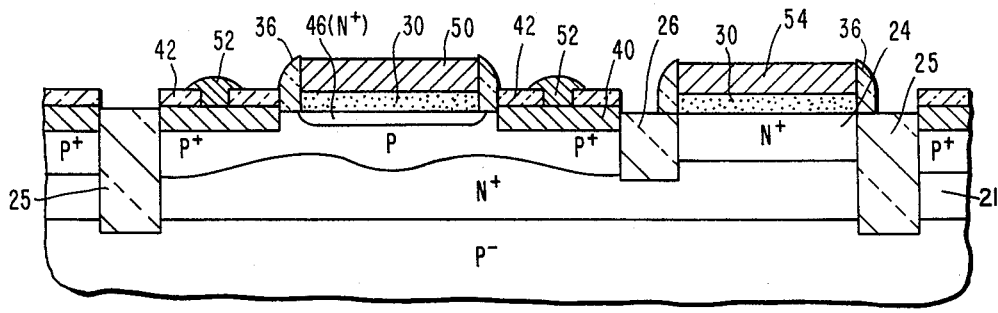

Openings are made through the silicon dioxide layer 42 to the base contact 40 by conventional lithographic and etching techniques. The metallization and formation of electrical contacts to the various elements are now accomplished by conventional techniques involving blanket metal deposition of a metal such as aluminum by vapor deposition and delineation is made by conventional lithography and etching or lift-off techniques to form the emitter contact 50, base contact 52 and collector contact 54 as illustrated in FIG. 7. Obviously, other metals or a combination of metals may be utilized for the electrical contacts to the bipolar integrated circuit structure of FIG. 7. Higher levels of metallurgy are then formed through insulation, blanket metallization, lithography and etching techniques to connect the various elements of the integrated circuits including the illustrated bipolar transistors to form suitable circuits in the integrated circuit structure.

Figure 2:
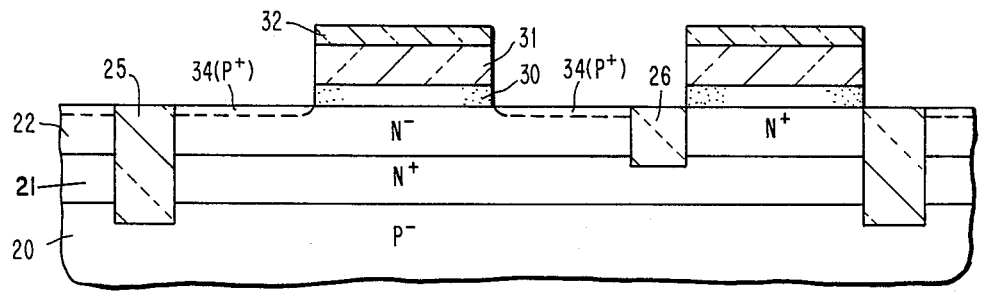
Figure 2A:
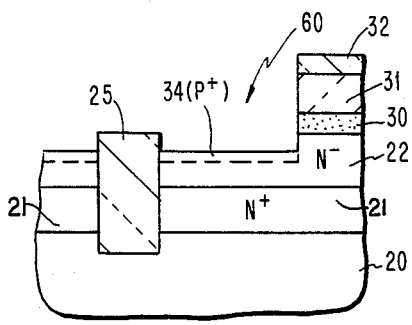
FIGS. 2A and 3A illustrate a modification of the FIGS. 1 through 7 process which is useful in overcoming side emitter injection.
Figure 3A:
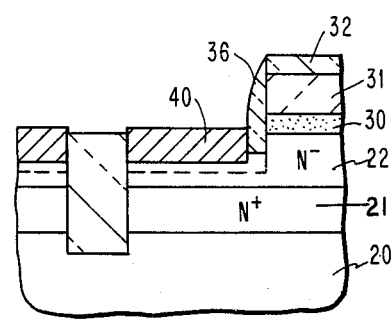
Figure 4:
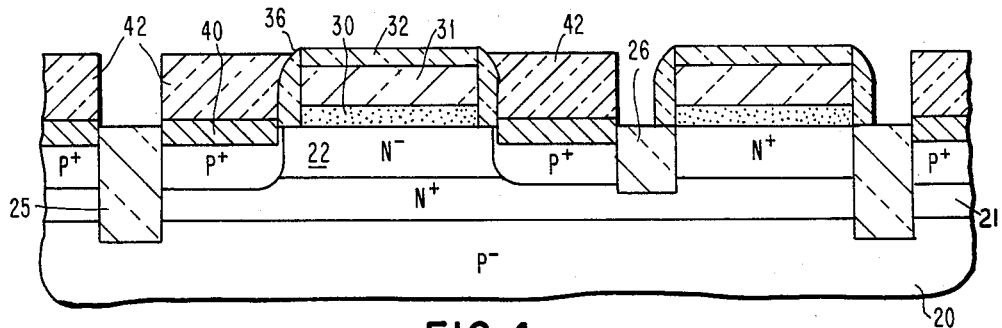

Referring now to FIGS. 2A and 3A a modification in the process illustrated FIGS. 1 through 7 embodiment may be done to reduce the side emitter injection problem. The process embodiment resulting in FIG. 2 is altered by continuing the etching of the polycrystalline silicon layer 30 past the complete etching of the polycrystalline silicon layer 30 and continuing into the monocrystalline silicon body. It is desired in this embodiment to etch between about 75 to 350 nanometers and preferably about 100 to 150 nanometers into the monocrystalline silicon body depending upon the emitter depth and base width. This is illustrated in FIG. 2A at point 60. The sidewall structure 36 will therefore extend accordingly into the monocrystalline silicon body. The emitter region is completely surrounded by sidewall silicon dioxide 36 and side injection from the emitter can no longer occur. The extrinsic base implant is done before the sidewall is grown and depth shallow. The depth of the implant depends upon the other element dimensions of the device. All other process steps are the same as the FIGS. 1–7 embodiment and result in a silicon dioxide isolated emitter that sees only the base below it. The modified FIG. 3 embodiment is shown as FIG. 3A.

While the invention has been particularly shown and described with reference to the preferred embodiment thereof, it will be understood by those skilled in the art that various changes in form and detail may be made therein without departing from the spirit and scope of the invention. For example, PNP bipolar transistors can be formed rather than the NPN transistor illustrated above by simply using opposite conductivity types for each of the regions described. Also, other devices than the bipolar transistors can be formed in the integrated circuit structure, such as field effect transistors, Schottky barrier structures and the like. The metal silicide contacts can be ohmic, Schottky, etc. and on N+, P+, N, P, N−, P−, etc. regions of silicon.

What is claimed is:

1. Method for making an electrical contact having a significant side component to a silicon semiconductor device comprising:

forming a metal silicide contact on the surface of a silicon body;

thermally oxidizing the surface of said metal silicide to form a silicon dioxide layer thereover and resulting in moving said metal silicide contact into said silicon body to the extent that said side contact component is formed greater than about 50 nanometers in depth;

forming an opening in said silicon dioxide layer to said metal silicide; and making electrical contact to said metal silicide contact.

2. The method of claim 1 wherein the said body is monocrystalline silicon and the said metal silicide is located upon a highly doped semiconductor region.

3. The method of claim 1 wherein the step of said thermally oxidizing is performed in a wet oxygen atmosphere at a temperature above 900° C.

4. The method of claim 1 wherein the step of thermally oxidizing is continued until between about 100 to 350 nanometers of silicon dioxide is formed upon said metal silicide layer and said metal silicide has been moved into said body between about 50 to 175 nanometers.

5. The method of claim 1 wherein said metal silicide is tantalum silicide.

6. The method of claim 1 wherein said metal silicide is tungsten silicide.

7. The method of claim 1 wherein said metal silicide is molybdenum silicide.

8. The method of forming a bipolar transistor with a highly conductive refractory metal silicide base contact having a significant side contact component, comprising:

providing a silicon semiconductor body having a subcollector region and having on one major surface regions of monocrystalline silicond dielectrically isolated from other such regions;

providing dielectric isolation between the emitter-base portion and collector reach-through portion of each of said regions designated to contain a bipolar transistor;

sequentially depositing layers on said major surface of polycrystalline silicon and an insulator in that order;

removing said layers of polycrystalline silicon and insulator and forming openings to said monocrystalline silicon above portions designated to be base contact areas and leaving said layer covering the designated emitter portion;

forming the extrinsic base region of said bipolar transistor through said openings;

forming a conformal insulator layer upon both the substantially horizontal regions and substantially vertical regions of said major surface;

anisotropically etching said insulator layer to substantially remove said horizontal layer and to provide a narrow dimensioned vertical insulator on the vertical sidewalls of said monocrystalline silicon and said layers;

depositing a layer of a refractory metal over said major surface;

heating the structure to a temperature sufficient to cause the formation of a refractory metal silicide where said refractory metal is on said portions of monocrystalline silicon designated to be base contact;

removing by etching the unreacted said refractory metal from over insulating layers;

thermally oxidizing the surface of said refractory metal silicide to form a silicon dioxide layer thereover and resulting in moving said metal silicide into the said monocrystalline silicon and providing said base contact having a significant side contact component;

reactive ion etching said major surface to remove said insulator layer covering said polycrystalline silicon layer over said designated emitter portion which leaves a portion of said silicon dioxide layer over said refractory metal silicide;

forming the emitter region; nd making electrical contact to the elements of said bipolar transistor.

9. The method of claim 8 wherein following said removing said layers of polycrystalline silicon, silicon dioxide, silicon nitride and forming openings to said monocrystalline silicon, the step of anisotropically etching said monocrystalline silicon through said openings to a desired depth with substantially vertical side walls whereby following the said anisotropically etching which provides said vertical insulator a substantially eliminates the side emitter injection.

10. The method of claim 8 wherein the depth to which said metal silicide moves into said monocrystalline silicon is between about 150 to 350 nanometers.

11. The method of claim 8 wherein said forming the emitter region includes ion implanting conductivity imparting impurities of the type the emitter region is planned into the polycrystalline silicon layer over said designated emitter portion; and heating to drive said impurities from said polycrystalline silicon layer into said designated emitter portion to form said emitter region.

12. The method of claim 8 wherein said insulator layer is a composite layer of a layer of silicon dioxide upon said polycrystalline silicon layer and silicon nitride upon said silicon dioxide.

13. The method of claim 8 wherein said subcollector is N type, said bse is P type and said emitter is N type.

14. The method of claim 9 wherein the said monocrystalline silicon is etched to a depth greater than the planned emitter-base junction depth.

15. The method of claim 11 wherein said polycrystalline silicon layer remains in the structure to be contacted by said electrical contact for contact to the said emitter of said transistor.

* * * * *